(12) United States Patent
Kajita et al.

(10) Patent No.: US 6,313,037 B1
(45) Date of Patent: Nov. 6, 2001

(54) SEMICONDUCTOR DEVICE AND METHOD FOR MANUFACTURING THE SAME

(75) Inventors: Akihiro Kajita, Yokohama; Noriaki Matsunaga, Chigasaki; Kazuyuki Higashi, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/576,255

(22) Filed: May 24, 2000

(30) Foreign Application Priority Data

May 25, 1999 (JP) .................................................. 11-145152

(51) Int. Cl.[7] .................................................... H01L 21/44
(52) U.S. Cl. .......................... 438/687; 438/688; 438/668; 438/672
(58) Field of Search ..................... 438/687–688, 438/675, 672, 668–669, 633

(56) References Cited

U.S. PATENT DOCUMENTS

| | | | |
|---|---|---|---|
| 5,693,568 | * 12/1997 | Liu et al. ............................... | 438/618 |
| 5,864,179 | * 1/1999 | Koyama ................................ | 257/767 |
| 5,915,203 | * 6/1999 | Sengupta et al. ..................... | 438/669 |
| 6,174,804 | * 1/2001 | Hsu ....................................... | 438/638 |
| 6,180,514 | * 1/2001 | Yeh et al. ............................. | 438/633 |
| 6,232,656 | * 5/2001 | Yabu et al. ........................... | 257/690 |

FOREIGN PATENT DOCUMENTS

409213794 * 8/1997 (JP) .............................. H01L/21/768

OTHER PUBLICATIONS

U.S. application No. 09/228,642, Hagashi et al., filed Jan. 1999.*

* cited by examiner

*Primary Examiner*—Charles Bowers
*Assistant Examiner*—Thanh Nguyen
(74) *Attorney, Agent, or Firm*—Finnegan, Henderson, Farabow, Garabow, & Dunner, L.L.P.

(57) ABSTRACT

A semiconductor comprising a semiconductor device formed on a semiconductor substrate, an interlevel insulating film having holes and a ring-shaped groove in a circuit area formed on the semiconductor substrate and having the semiconductor element formed therein, the ring-shaped groove seamlessly surrounding an outer periphery of the circuit area, via plugs formed in the holes in the interlevel insulating film, a wiring connected to the plug electrodes and mainly comprising copper, and a via ring having a layer formed in the ring-shaped groove and mainly comprising aluminum, wherein no layer mainly comprising copper is formed in the via ring layer.

6 Claims, 4 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 11-145152, filed May 25, 1999, the entire contents of which are incorporated herein by reference.

BACKGROUND OF THE INVENTION

The present invention relates to a semiconductor device comprising a Cu wiring and a metal barrier that seamlessly covers outer peripheral portions of a circuit area, and also to a method for manufacturing the semiconductor device.

Semiconductor devices, which are represented by high-performance logic LSIs, require RC delays in transmitted signals to be restrained for fast operations. Thus, as a fine metal wiring material, Cu, which has a low resistance, is gathering much attention instead of conventional Al alloys. In using a Cu wiring, Cu must be prevented from diffusing to areas other than wirings. This is because due to its fast diffusion through an insulating film such as a silicon oxide film, which is commonly used as an interlevel insulating film, Cu may diffuse to a semiconductor element layer to reduce the lifetime of carriers or to degrade the voltage resistance of a gate oxide film. Thus, in the conventional use of a Cu wiring, a nitride of a high-melting-point metal such as TiN or TaN, which has a Cu diffusion preventing function, is combined with an insulating film such as silicon nitride, which also has the same function, to form a diffusion preventing layer around the Cu wiring.

On the other hand, in a semiconductor device, an element layer comprising MOS transistors or the like as well as a multilevel wiring are formed on an Si wafer, which is then cut into chips by means of a dicing step, irrespective of the use of a Cu wiring. During the dicing step, a dicing blade is used to cut a laminate layer consisting of various thin films, so that cracks may occur in a layer with the multilevel wiring formed therein and propagate through the chip to destroy the multilevel wiring layer.

Accordingly, in order to prevent cracks from propagating through the chip if they occur in a cut surface of the chip during the dicing step, known methods form a ring-shaped metal wall inside a dicing area in an outer peripheral portion of the chip which surrounds the chip. This ring-shaped metal wall is formed by forming a ring-shaped pattern both during a multilevel wiring step and during a step of embedding metal in interlevel connection holes (contact or via holes) (the ring-shaped metal wall is hereafter referred to as a "via ring"). That is, in a conventional semiconductor device with a multilevel wiring structure consisting of Al metal wirings formed, for example, by means of a RIE process and W via (contact) plugs formed by embedding W in the connection holes by means of the CVD process, an Al alloy via ring is formed in the outer peripheral portion of the chip during a step of forming an Al alloy thin film into wirings, a ring-shaped groove is subsequently formed on the Al via ring area during a step of forming via holes in the interlevel insulating film, and W is then embedded in the ring-shaped groove to form a w via ring during a step of embedding w in via holes. These steps can be repeated for the number of multilevel wiring levels to form in the multilevel wiring level area the via ring consisting of the Al alloy and the W laminate structure.

The via ring thus formed is effective as a barrier layer that prevents moisture from osmosing from side surfaces of the chip after the dicing. The moisture osmosed into the chip from its side surfaces may corrode the Al alloy constituting the wirings or may cause MOS transistors to malfunction. The use of the via ring structure, however, can prevent these problems.

If, however, Cu is used for the multilevel wirings, the conventional via ring structure and manufacturing method therefor are disadvantageous for the following reasons: according to the conventional via ring manufacturing method, portions of the chip which correspond to the via ring wiring level and via (contact) plugs consist of the Cu covered with a barrier metal. In this case, the barrier metal has a film thickness of 1 to 50 nm, which is much smaller than the sectional dimensions of the via ring. This is because the barrier metal, which has a high resistivity, must have a sufficiently smaller film thickness (or wiring width or via hole diameter) than the Cu, which is the main wiring material, in order to reduce the wiring and via resistances in the multilevel wiring area. Such a thin barrier metal functions as an insufficient crack propagation-preventing layer during the dicing step; if cracks occur, the coverage of the Cu with the barrier metal may be partly destroyed to diffuse the Cu from a break point to the inside of a circuit area (inside the via ring), resulting in the malfunction of transistors.

In addition, if the via ring barrier layer is destroyed in the above manner, the Cu attached to the chip side surface during the dicing step cannot be precluded from diffusing to the inside of the circuit area, resulting in the same problem as described above. Further, the osmosis of moisture through the chip side surface may cause the Cu to oxidize or corrode at the break point of the barrier metal, and the moisture osmosed into the circuit area may oxidize or corrode wirings to affect their operations or may cause the MOS transistors to malfunction.

BRIEF SUMMARY OF THE INVENTION

It is an object of the present invention to provide a semiconductor device and a method for manufacturing the same, that avoids Cu diffusion or moisture osmosis from a via ring to a semiconductor element circuit even with a wiring layer provided on a semiconductor substrate and mainly comprising Cu, thereby preventing the semiconductor element from malfunctioning.

To attain this object, this invention is configured as described below.

A semiconductor device according to the present invention is characterized by a circuit area defined in a semiconductor substrate; a semiconductor element formed in the circuit area; an interlevel insulating film having a hole reached the semiconductor element and a ring-shaped groove seamlessly surrounding an outer periphery of the circuit area; a via plug formed in the hole in the interlevel insulating film; a wiring connected to the via plug and mainly comprising copper; and a via ring formed in the ring-shaped groove and mainly comprising aluminum, wherein: no layer mainly comprising copper is formed in the via ring layer.

A preferred form of this semiconductor device manufacturing method will be described below.

(a) The via plug is configured in the same manner as the via ring.

A method for manufacturing the semiconductor device according to the present invention is characterized by comprising the steps of depositing a thin Al film on a semiconductor substrate having a semiconductor element formed in a circuit area, the thin Al film mainly comprising aluminum, patterning the thin Al film to form via plugs in the circuit area and forming a via ring surrounding the circuit area, depositing an insulating film on the semiconductor substrate in such a manner as to cover the via plugs and the via ring, flattening a surface of the insulating film to expose surfaces of the via plugs and via ring, and forming a wiring mainly comprising copper and which is connected to the via plugs.

A preferred form of this semiconductor device manufacturing method will be described below.

(a) The step of forming the wiring mainly comprising copper includes the steps of forming a resist pattern having a wiring area exposed from the insulating film in the circuit area, the resist pattern covering the insulating film in an area with the via ring formed therein, etching the insulating film to form in the circuit area a groove shaped in a wiring pattern, and embedding and forming in the groove a wiring material mainly comprising copper.

(b) Before the embedding and formation of the wiring material, a barrier metal is formed on a surface of the wiring-patterned groove for restraining copper diffusion.

In addition, a method for manufacturing the semiconductor device according to the present invention is characterized by comprising the steps of depositing a thin Al film on a semiconductor substrate having a semiconductor element formed in a circuit area, the thin Al film mainly comprising aluminum, depositing a silicon nitride film on the thin Al film, patterning the silicon nitride film to shape a plug pattern in the circuit area and a ring seamlessly surrounding an outer periphery of the circuit area, using the silicon nitride film as a mask to etch the thin film in order to form via plugs in the circuit area while forming a via ring surrounding the circuit area, depositing an insulating film on the semiconductor substrate in such a manner as to cover the via plugs and the via ring, using the silicon nitride film as a stopper to flatten a surface of the insulating film, forming a resist pattern having a wiring area exposed from the insulating film in the circuit area, the resist pattern covering the insulating film in an area with the via ring formed therein as well as the silicon nitride film, etching the insulating film and the silicon nitride film to form in the circuit a groove shaped in a wiring pattern, and embedding and forming in the groove a wiring material mainly comprising copper.

(a) A preferred form of this semiconductor manufacturing method will be described below.

Before the embedding and formation of the wiring material, a barrier metal is formed on surfaces of the via holes and wiring groove for restraining copper diffusion.

(b) The silicon nitride film is formed to be substantially as thick as the wiring.

With this configuration, the present invention has the following operations and effects.

Since the via ring formed in the outer periphery of the circuit area comprises a layer mainly comprising Al without a layer mainly comprising Cu, no Cu diffusion occurs from the via ring to the inside of the semiconductor element circuit. In addition, the via ring has no thin barrier metal layer, which has a small film thickness, so that the via ring is unlikely to be destroyed during dicing, thereby precluding moisture from infiltrating into the circuit area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the drawings.

[Embodiment 1]

In this embodiment, description will be made of the structure of a via ring in a semiconductor device using a Cu wiring as a fine metal wiring, the via ring comprising an Al alloy and a silicon nitride film laminated in an outer periphery of a semiconductor chip, as well as a method for manufacturing the via ring.

In this embodiment, to form a multilevel wiring structure in a semiconductor device, a manufacturing method is used which forms columnar structures (Al pillars) in a thin Al alloy film using lithography and reactive ion etching (RIE) and which then uses the Al pillars as connection plugs (via or contact plugs) between wiring levels. Each of the wiring layers is formed by the Damascene method by embedding Cu, a wiring metal, and thin barrier metal films in grooves formed in the insulating film using lithography and RIE. In this case, the via ring structure consisting of the Al alloy and the silicon nitride film, which is characteristic of the present invention, can be formed simultaneously with a multilevel wiring-forming step.

The process for manufacturing the via ring according to this embodiment will be described with reference to FIGS. 1A to 1J.

Figure 1A:
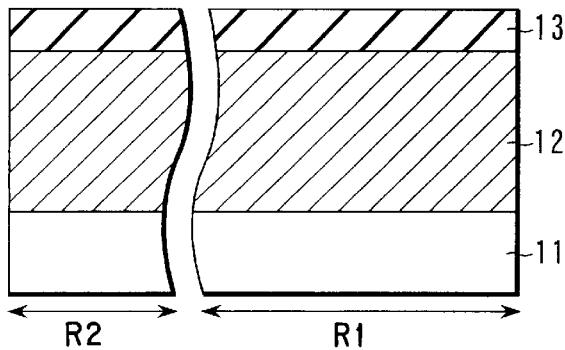
FIGS. 1A to 1J are process sectional views showing a process for manufacturing a semiconductor device according to a first embodiment of the present invention.
Figure 1D:
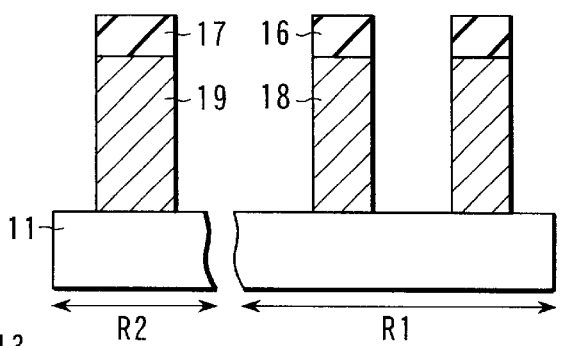

First, as shown in FIG. 1A, a conventional film formation method such as sputtering is used to form an Al alloy layer 12 on a silicon semiconductor layer (a semiconductor substrate) 11 in such a manner as to have a film thickness corresponding to via plugs. The Al alloy may be an alloy containing Al and a small amount of either Cu or Si, an alloy containing Al and small amounts of both Cu and Si, or pure Al. A circuit area RI in the silicon semiconductor layer 11 has a semiconductor element (not shown) formed therein. In FIGS. 1A to 1J, R1 denotes a cross section of the circuit area and R2 denotes a cross section of a via ring area between the circuit area R1 and a dicing area R3 (FIG. 2). Next, a silicon nitride film 13 is formed on the Al alloy layer 12 by means of plasma CVD or the like. The silicon nitride film 13 has substantially the same thickness as a wiring formed in a layer on the via plugs.

Figure 1B:
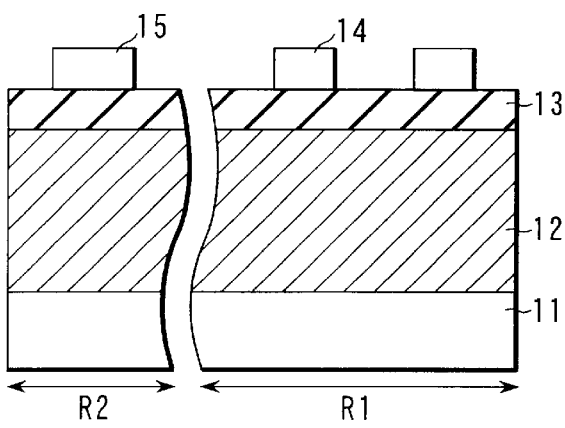
Figure 2:
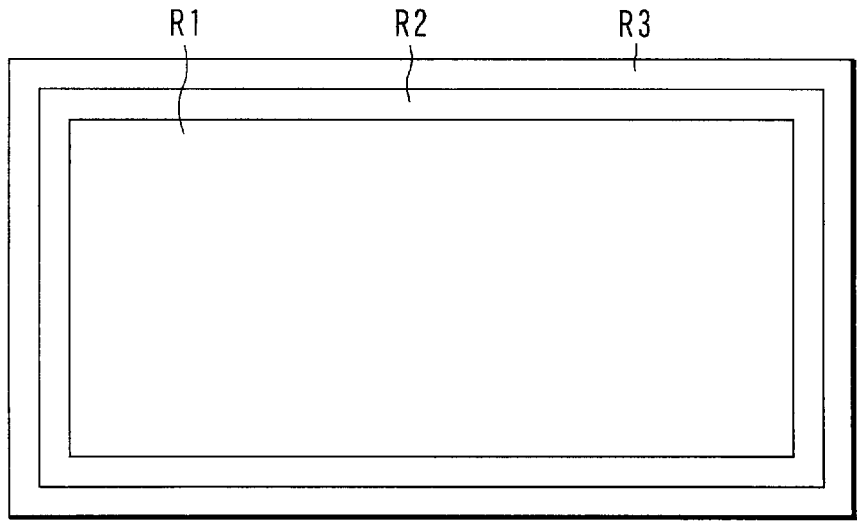
FIG. 2 is a top view showing the configuration of the semiconductor device according to the first embodiment.

Then, as shown in FIG. 1B, a lithography step is used to selectively form resist patterns 14, 15 on the silicon nitride film 13 in predetermined areas with a via ring and the via plugs located therein. A resist pattern 14 is formed in the circuit area RI so as to cover the area with the via plugs formed therein. A resist pattern 15 is formed in the via ring area R2 so as to seamlessly surround peripheries of the circuit area R1.

Figure 1E:
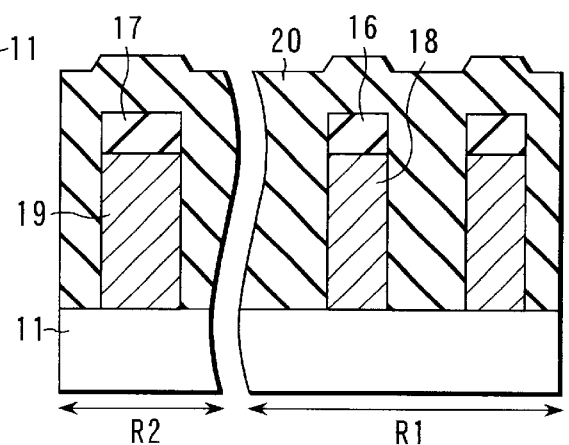
Figure 1C:
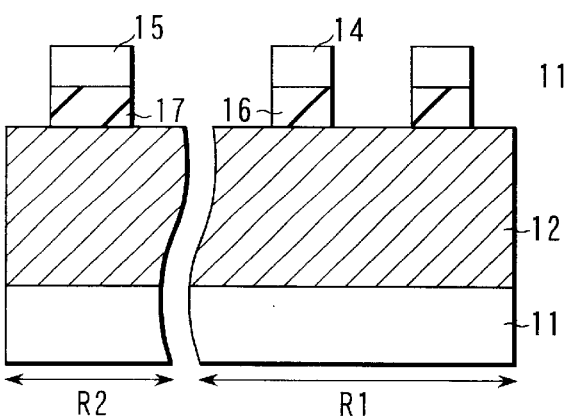

Then, as shown in FIG. 1C, the resist patterns 14, 15 are used as a mask to process the silicon nitride film 13 by means RIE using fluorocarbon as an etching gas. This RIE step forms an island-like silicon nitride film 16 in the circuit area R1, while forming a ring-shaped silicon nitride film 17 in the via ring area R2 in such a manner as to surround the circuit area R1.

Then, as shown in FIG. 1D, the resist patterns 14, 15 are removed by means of ashing, and the silicon nitride films 16, 17 are used as an etching mask (hard mask) to process the Al alloy layer 12 by means of RIE. The etching gas for this RIE step may be chiefly composed of $BCl_3$ and $Cl_2$. This RIE step forms Al alloy pillars 18 in the circuit area R1, while forming in the via ring area R2 an Al alloy ring 19 consisting of a ring-shaped Al alloy. The Al alloy pillars 18 and the Al alloy ring 19 have the silicon nitride films 16, 17 formed thereon and having the same cross section.

Then, as shown in FIG. 1E, an interlevel insulating film 20 is deposited on surfaces of the Al alloy pillars 18, Al alloy ring 19, and silicon nitride films 16, 17. A surface of the interlevel insulating film 20 on the silicon semiconductor layer 11 is formed to be higher than the surfaces of the silicon nitride films 16, 17. The interlevel insulating film 20 is deposited by means of the plasma CVD process or the spin coat process. The material of the interlevel insulating film 20 may be conventional $SiO_2$, $SiO_2$ with F addition, organic silicate, inorganic silicate, or their laminate. In order to reduce the coupling capacity between wiring levels or wirings, the interlevel insulating film 20 material desirably has a low dielectric constant.

Figure 1F:
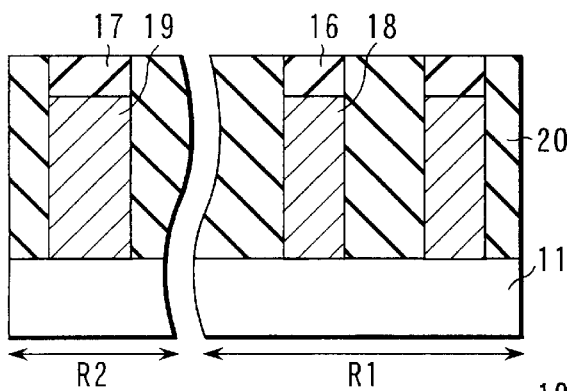

Then, as shown in FIG. 1F, a flattening technique such as the CMP process is used to flatten the surface of the interlevel insulating film 20. In this case, the silicon nitride films 16, 17 act as an etching stopper.

Figure 1I:
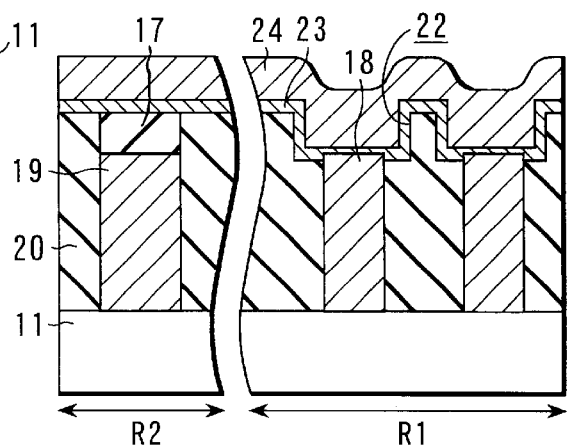
Figure 1G:
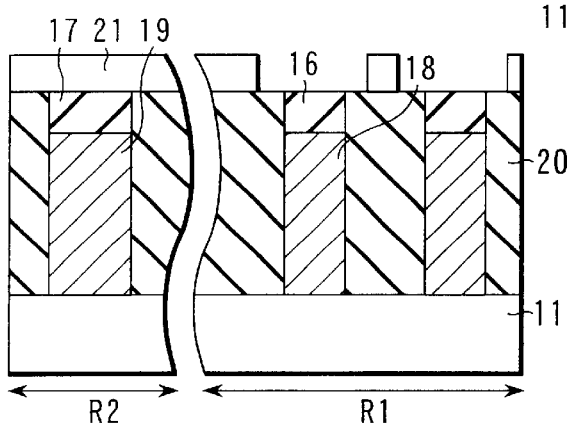

Then, as shown in FIG. 1G, to form a groove in which an upper level wiring for connection to the via plugs is embedded, the lithography step is used to form a resist pattern 21 having openings in an area in which the upper level wiring is to be formed. In this case, the surface of the silicon nitride film 17 in the via ring area R2 is covered with the resist pattern 21.

Figure 1J:
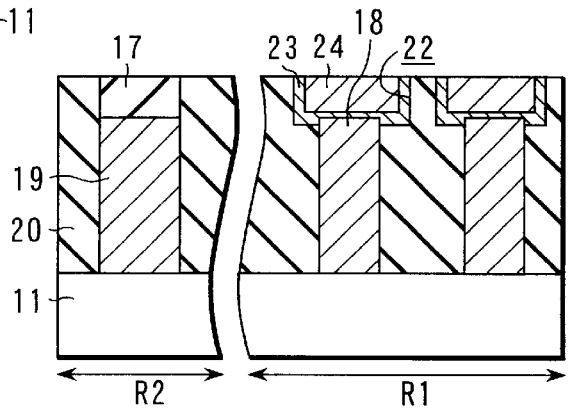
Figure 1H:
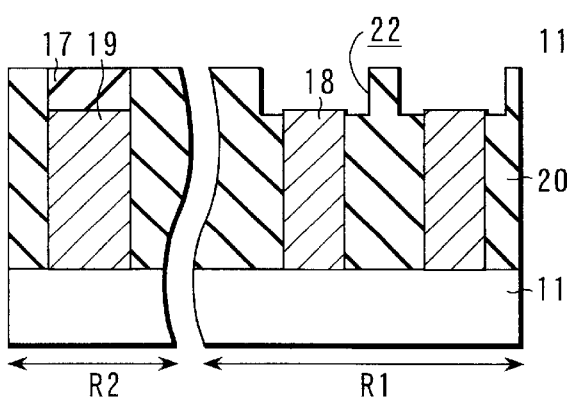

Then, as shown in FIG. 1H, the resist pattern 21 is used as a mask to form grooves 22 with the upper wiring embedded and formed therein. During this RIE step, the silicon nitride film 16 present in the circuit area R1 is removed, with the silicon nitride film 17 remaining in the via ring area R2.

Then, as shown in FIG. 1I, the sputtering process is used to form a barrier metal layer 23 consisting a nitride of a high-melting-point metal such as TiN or TaN, so as to cover surfaces of the grooves 22. In addition to the high-melting-point metal nitride, the barrier metal layer 23 may be comprised of an arbitrary material that has a function of preventing the Cu from diffusing to the inside of the interlevel insulating film 20. After deposition of the barrier metal layer 23, a thin Cu film 24 is deposited so as to be embedded in the grooves 22. The method for forming the thin Cu film 24 may be the sputtering process, the plating process, the CVD process, or their combination. Since the via ring area R2 is free from recesses, the barrier metal layer 23 and the thin Cu layer 24 are formed to be flat.

As shown in FIG. 1J, the CMP process is used to remove extra parts of the barrier metal layer 23 and thin Cu film 24 which are not located inside the grooves 22, thereby forming a Cu wiring in the grooves 22. During the CMP, those parts of the barrier metal layer 23 and thin Cu film 24 which are located in the via ring area R2 are removed, thereby preventing the thin Cu film and the barrier metal layer from remaining in the via ring area R2.

The above described process can form in the outer periphery of the semiconductor circuit the via ring consisting of the Al alloy and silicon nitride. Since the via ring thus formed contains no Cu to avoid Cu diffusion from the via ring to the circuit area, the malfunctioning of the semiconductor device arising from the presence of Cu can be prevented to improve the reliability of the semiconductor device.

During a dicing step after the formation of the semiconductor device on a Si wafer, this via ring can effectively preclude cracks in a cut surface from propagating through the circuit. Consequently, the wiring can be prevented from being destroyed due to cracks, thereby improving the non-defective unit yield of the semiconductor device.

The via ring consisting of the Al alloy and silicon nitride acts as a barrier against osmosis of moisture from the exterior of the chip to preclude the device from malfunctioning due to the osmosis of moisture into the circuit area, while preventing the Cu wiring from being oxidized or corroded because of moisture, thereby improving the reliability of the semiconductor device.

[Second Embodiment]

Next, a manufacturing method different from Embodiment 1 will be explained.

FIGS. 3A to 3G are process sectional views showing a process for manufacturing a semiconductor device according to a second embodiment of the present invention.

Figure 3A:
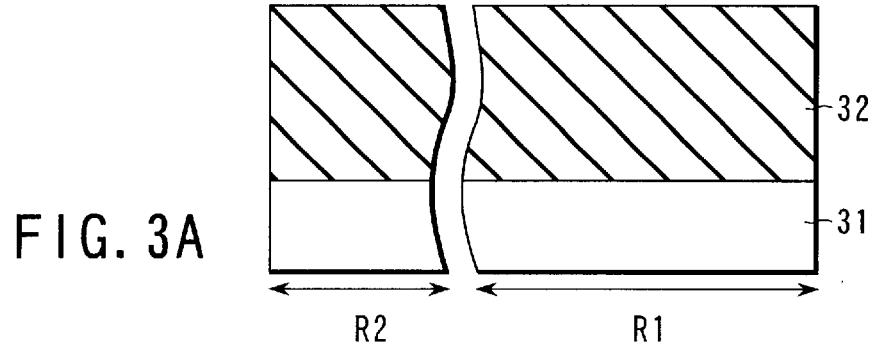
FIGS. 3A to 3G are process sectional views showing a process for manufacturing a semiconductor device according to a second embodiment of the present invention.

First, as shown in FIG. 3A, an interlevel insulating film 32 is deposited on a Si semiconductor layer 31, the interlevel insulating film 32 having a film thickness corresponding to the total of via plugs and a wiring layer. In FIGS. 3A to 3G, R1 denotes a cross section of a circuit area and R2 denotes a cross section of a via ring area between the circuit area and a dicing area.

Figure 3B:
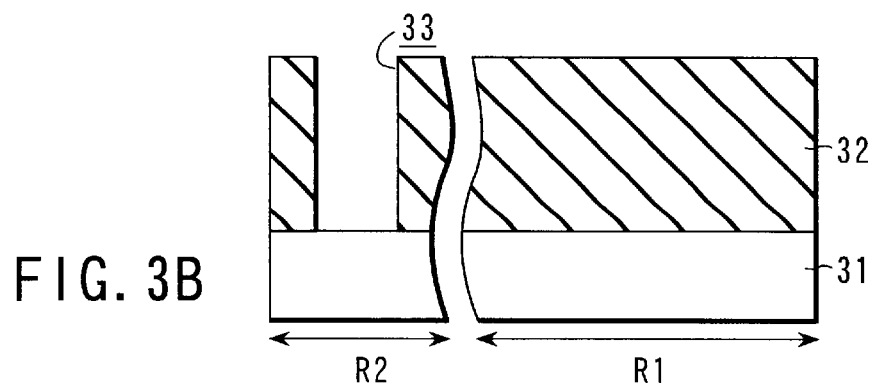
Figure 3C:
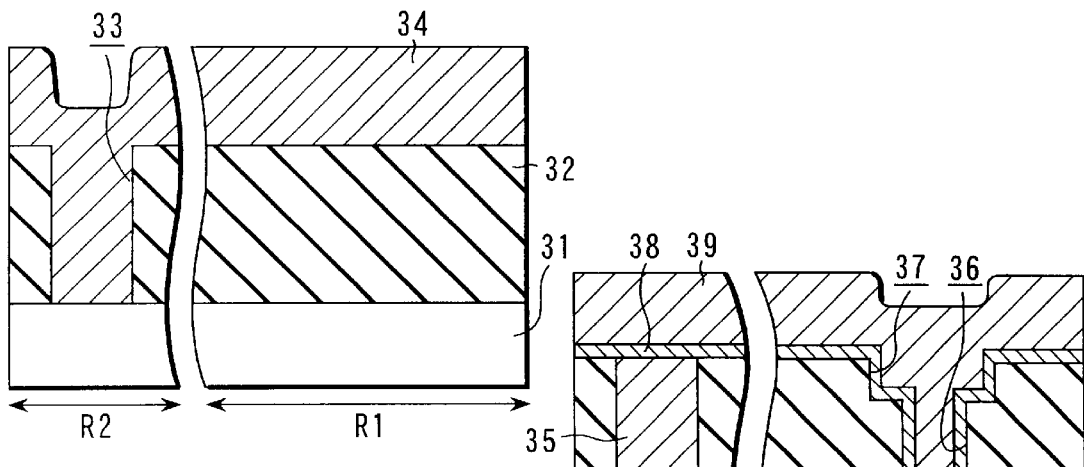
Figure 3F:
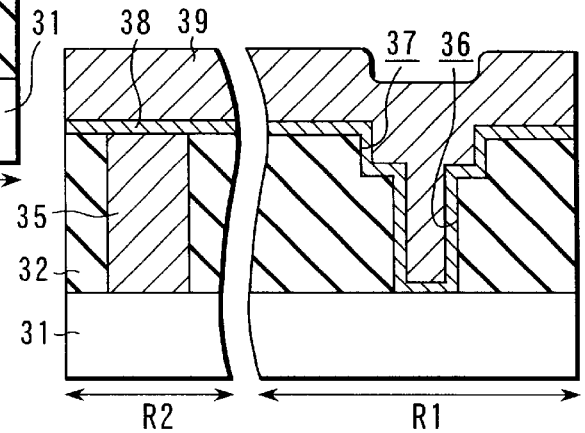
Figure 3D:
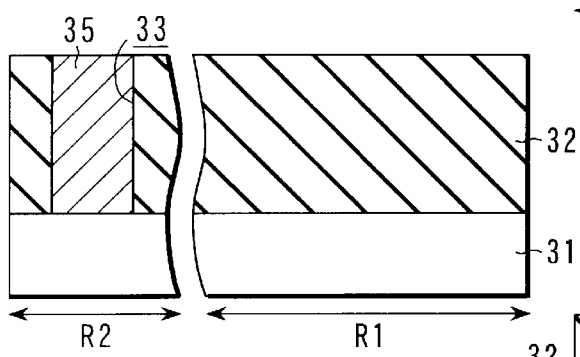

Then, as shown in FIG. 3B, a ring-shaped groove 33 is formed in the via ring area R2 so as to seamlessly surround an outer periphery of the circuit area R1. Then, as shown in FIG. 3C, an Al alloy layer 34 chiefly composed of Al is formed so as to be embedded in the groove 33. Then, as shown in FIG. 3D, a flattening technique such as the CMP method is used to remove an extra part of the Al alloy layer 34 located on the interlevel insulating film 32, thereby embedding and forming an Al via ring 35 in the groove 33.

Figure 3G:
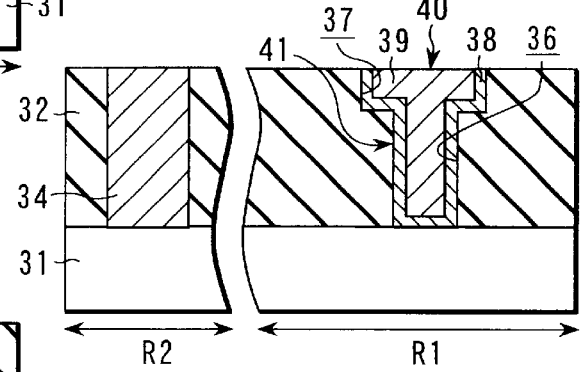
Figure 3E:
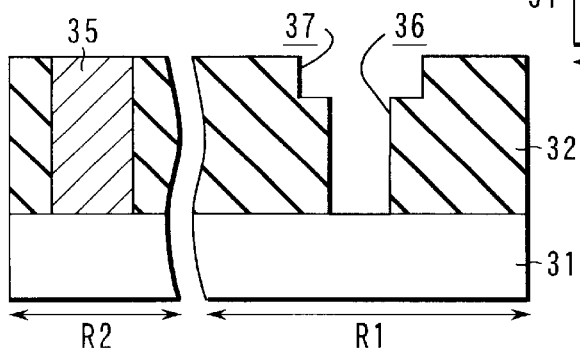

Then, as shown in FIG. 3E, a via hole 36 and a wiring groove 37 are formed in the interlevel insulating film 32 in the circuit area R1. Then, as shown in FIG. 3F, a barrier metal layer 38 and a thin Cu film 39 are sequentially deposited. Then, as shown in FIG. 3G, the CMP process is used to remove extra parts of the barrier metal layer located on the interlevel insulating film 32, thereby forming a Cu wiring layer 40 in the wiring groove 37, while forming a Cu via plug 41 in the via hole 36.

This manufacturing method can also form a via ring without a layer chiefly composed of Cu.

The present invention is not limited to the above described embodiments, but various variations may be made thereto without deviating from the spirits and scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:
   depositing a thin Al film on a semiconductor substrate having a semiconductor element formed in a circuit area, the thin Al film mainly comprising aluminum;
   patterning the thin Al film to form via plug reached the semiconductor and forming a via ring surrounding the circuit area;
   depositing an insulating film on the semiconductor substrate in such a manner as to cover the via plug and the via ring;
   flattening a surface of the insulating film; and
   forming a wiring mainly comprising copper and which is connected to the via plugs.

2. A method for manufacturing a semiconductor device according to claim 1, wherein the step of forming the wiring mainly comprising copper includes the steps of:
   forming a resist pattern having a wiring area exposed from the insulating film in the circuit area, the resist pattern covering the insulating film in an area with the via ring formed therein;
   etching the insulating film to form in the semiconductor element circuit a groove shaped in a wiring pattern; and
   embedding and forming in the groove a wiring material mainly comprising copper.

3. A method for manufacturing a semiconductor device according to claim 2, wherein before the embedding and formation of the wiring material, a barrier metal is formed on a surface of the wiring-patterned groove for restraining copper diffusion.

4. A method for manufacturing a semiconductor device, comprising the steps of:
   depositing a thin Al film on a semiconductor substrate having a semiconductor element formed in a circuit area, the thin Al film mainly comprising aluminum;
   depositing a silicon nitride film on the thin Al film;
   patterning the silicon nitride film to shape a plug pattern in the circuit area and a ring seamlessly surrounding an outer periphery of the circuit area;
   using the silicon nitride film as a mask to etch the thin film in order to form via plugs in the circuit area while forming a via ring surrounding the circuit area;
   depositing an insulating film on the semiconductor substrate in such a manner as to cover the via plugs and the via ring;
   using the silicon nitride film as a stopper to flatten a surface of the insulating film;
   forming a resist pattern having a wiring area exposed from the insulating film in the circuit area, the resist pattern covering the insulating film in an area with the via ring formed therein as well as the silicon nitride film;
   etching the insulating film and the silicon nitride film to form in the semiconductor element circuit a groove shaped in a wiring pattern; and
   embedding and forming in the groove a wiring material mainly comprising copper.

5. A method for manufacturing a semiconductor device according to claim 4, wherein before the embedding and formation of the wiring material, a barrier metal is formed on surfaces of the via holes and wiring groove for restraining copper diffusion.

6. A method for manufacturing a semiconductor device according to claim 4, wherein the silicon nitride film is formed to be substantially as thick as the wiring.

* * * * *